United States Patent [19]
Ichiryu et al.

[11] Patent Number: 4,946,746
[45] Date of Patent: Aug. 7, 1990

[54] METAL FIBER AND PROCESS FOR PRODUCING THE SAME

[75] Inventors: Takaharu Ichiryu; Yoshiki Ono; Hideaki Ishihara, all of Ohtsu, Japan

[73] Assignee: Toyo Boseki Kabushikia Kaisha, Osaka, Japan

[21] Appl. No.: 280,320

[22] Filed: Dec. 6, 1988

[30] Foreign Application Priority Data

| Dec. 8, 1987 | [JP] | Japan | 62-310259 |
| Dec. 8, 1987 | [JP] | Japan | 62-310260 |
| Dec. 8, 1987 | [JP] | Japan | 62-310261 |
| Dec. 8, 1987 | [JP] | Japan | 62-310262 |
| Dec. 8, 1987 | [JP] | Japan | 62-310263 |

[51] Int. Cl.$^5$ .......................... C21D 9/52; B22D 11/00
[52] U.S. Cl. .................................. 428/606; 148/300; 148/308; 148/309; 164/462
[58] Field of Search ............... 164/462, 463, 423, 429; 148/300, 301, 308, 309, 400, 403, 404; 428/606

[56] References Cited

U.S. PATENT DOCUMENTS

| 2,825,108 | 3/1958 | Pond | 164/462 |
| 4,242,368 | 12/1980 | Nagai et al. | 164/463 |
| 4,257,830 | 3/1981 | Tsuya et al. | 164/462 |
| 4,495,691 | 1/1985 | Masumoto et al. | 148/403 |
| 4,496,395 | 1/1985 | Croat | 164/462 |
| 4,523,626 | 6/1985 | Masumoto et al. | 164/463 |
| 4,617,983 | 10/1986 | Tsubata et al. | 164/463 |
| 4,702,302 | 10/1987 | Sawada | 164/463 |

FOREIGN PATENT DOCUMENTS

| 59-80725 | 5/1984 | Japan | 164/463 |
| 59-223145 | 12/1984 | Japan | 164/463 |
| 63-68245 | 3/1988 | Japan | 164/463 |

Primary Examiner—John J. Zimmerman
Attorney, Agent, or Firm—Wegner & Bretschneider

[57] ABSTRACT

A metal fiber having unidirectional dendritic texture which is an assembly of a group of dendrites wherein primary arms have grown at angle of within 20° relative to the metal fiber axis, diameter of said fiber being not greater than 100 μm. There is also disclosed a single crystalline metal fiber which is a single crystalline material throughout the entire length, diameter of said fiber being not greater than 100 μm, length of said fiber being not less than 40 mm. These fibers can be produced by melt-spinning of metal.

30 Claims, 4 Drawing Sheets

METAL FIBER AND PROCESS FOR PRODUCING THE SAME

FIELD OF THE INVENTION

The present invention relates to a novel metal fiber, particularly, a high performance soft magnetic metal fiber which can be easily magnetized, and a process for producing the same. More particularly, the novel metal fiber of the present invention has excellent toughness and is useful as a component for an electromagnetic material and a composite material, which is expected to be applicable to various fields by utilizing its characteristic properties.

BACKGROUND OF THE INVENTION

There are many studies and proposals on metal fibers including approach on new materials and developments of their use and the applicable fields are becoming wider and wider.

As a process for producing a metal fiber, various processes have been known, for example, as follows:

(1) A process wherein a rod-like metal material is drawn by using a die made of hard metal or diamond.

In this process, a multistage wire drawing treatment is required to obtain a fine fiber. In addition, in order to remove internal strain generated in the wire drawing step, an annealing step is required and, therefore, many steps are required, which makes the process complicated and adversely affects productivity.

(2) A process wherein a solid metal material is cut to obtain a chip-like wire.

In comparison with the above process (1), this process is more convenient and simpler and requires fewer steps. However, in this process, cross sections of the fibers obtained are not uniform and, further, cut defects and the like are liable to be caused on the surface of the fibers. Therefore, there is a problem in homogeneity of fibers (3) A melt spinning process wherein a molten metal is extruded from a nozzle having a small diameter, a slit or the like, and then solidified by cooling.

This process includes a glass coating-spinning process, spinning in a flowing coolant, spinning in rotating liquid and the like. By using these processes, crystalline or amorphous fibers of various metals or alloys have been produced. Particularly, developments of many new materials have been advanced by utilizing a quenching solidification phenomenon.

Under these circumstances, the present inventors have studied a process for producing a metal fiber using a melt spinning process, particularly, spinning in rotating liquid. As the results, the present inventors have already filed patent applications, i.e, Japanese Patent Kokai Nos. 61-87849, 62-56393 and 63-75118.

These applications are directed to a potential improvement of a melt spinning process of an iron alloy and a process for producing a metal fiber having a specific structure wherein single crystals of various sizes are linked serially in such a way that grain boundaries are present between respective single crystals like "bamboo".

By the way, as the technical revolution progresses, a demand for miniaturizing and weight-saving of electromagnetic apparatuses is increased more and more. In order to satisfy such a demand, for example, molding of a magnetic material into fibers can be considered as one of the methods for miniaturizing an electromagnetic apparatus. In this case, in order to improve magnetic properties of a fiber-like magnetic material, it is of importance to obtain an easily magnetizable structure by minimizing defects such as grain boundary and impurities as well as internal strain. Further, in order to obtain a soft magnetic fiber which is anisotropic toward the fiber axis direction and has a high permeability, a high squareness ratio, a low coercive force and a high saturation magnetic flux density, it is necessary to arrange directions of the easily magnetizable axis of crystals toward that of the fiber axis of the soft magnetic fiber.

OBJECTS OF THE INVENTION

The present inventors have continued to study a process for producing a metal fiber mainly by spinning in rotating liquid and a method for improving properties of a metal fiber and have attained the present invention.

Thus, one object of the present invention is to provide a metal fiber having a crystal texture different from that of a conventional metal fiber and obtained by appropriately setting melt spinning conditions, heat treatment conditions and the like, which can provide a further wider application field.

Another object of the present invention is to provide a process for producing such a metal fiber.

Still another object of the present invention is to provide a high performance soft magnetic fiber having a high specific permeability, a high squareness ratio, a low coercive force and a high saturation magnetic flux density which can be obtained by minimizing defects such as grain boundary and internal strain of drystals to make magnetization easy, and imparting structural properties so that the directions of easily magnetizable axes are arranged toward that of the fiber axis.

These objects as well as other objects and advantages of the present invention will become apparent to those skilled in the art from the following description with references to the accompanying drawing.

SUMMARY OF THE INVENTION

One aspect of the present invention is to provide a metal fiber having a unidirectional dendritic texture which is an assembly texture of a group of dendrites wherein primary arms have grown at an angle of, at largest, 20° relative to the metal fiber axis, a diameter of said metal fiber being not larger than 100 $\mu$m. This metal fiber can be produced by melt-spinning a molten metal from a spinning nozzle not larger than 100 $\mu$m in diameter, and quenching it to solidify.

As the second aspect of the present invention, there is provided a single crystalline metal fiber which is a single crystalline material throughout the entire length, the diameter of said fiber being not larger than 100 $\mu$m, length of said fiber being not less than 40 mm. This metal fiber can be produced by melt-spinning a molten metal from a spinning nozzle not larger than 100 μm in diameter, quenching it to solidify, and heat-treating the resulting wire to effect homogenization.

By the way, the term "single crystalline" used herein does not mean an ideal single crystal grown from a single nucleus without grain boundary which is consisting of a space lattice wherein molecules and atoms arrange regularly, but means a crystal having defects such as dislocations and sub-boundary. And, the term "sub-boundary" used herein means a boundary where orientations of crystals differ from each other in an angle range of not larger than a few degrees.

DETAILED DESCRIPTION OF THE INVENTION

As known in the art, spinning in rotating liquid is a process wherein a cooling liquid layer is formed on the inner circumferential surface of a rotating cylindrical hollow drum by centrifugal force and a molten metal is injected in the form of a fine wire into the cooling liquid layer from a nozzle having a small diameter to quench the wire to solidify. Then, the wire is wound on the inner circumferential surface of the hollow drum or on another suitable apparatus as it is. By this process, fine fibers can be produced from various metal materials.

By the way, depending upon the particular kind of alloys, toughness of a metal fiber obtained by the above process varies according to its diameter. Particularly, a metal fiber having a larger diameter is difficult to handle because it is very brittle and readily broken when it is bent at an angle of 90° or more. Therefore, sometimes, the use thereof is limited. It has been recognized that, in an internal structure of a conventional metal fiber having less toughness, two or more crystal grains are always present in any cross section which is vertical relative to the fiber axis and a so-called polycrystalline structure is observed. On the contrary, in a metal fiber having a smaller diameter, for example, about 130 μm in diameter, as described in Japanese Patent Kokai No. 62-56393, there is observed such a structure that single crystalline parts like "internodes of bamboo joints" are linked along the fiber axis direction at irregular intervals of about 0.1 to 5 mm, and such a single crystalline structure part has excellent toughness so that the fiber becomes flexible and is not broken even if it is bent at the angle of 180° at the "bamboo joint" part.

However, even in this metal fiber, toughness and flexibility at a "bamboo joint" part corresponding to the grain boundary are inferior and the metal fiber may be broken when it is bent at the angle of about 180° at the "bamboo joint" part.

The present inventors have further continued to study. As the results, it has been found as follows:

(1) When the diameter of a nozzle for spinning in rotating liquid is set at 100 μm or smaller and a quenching rate for solidifying a molten metal make much faster, an assembly texture composed of a group of dendrites arranged toward the fiber axis direction can be obtained.

(2) As the diameter of a spinning nozzle and that of a fiber become smaller, an angle between primary arms of the dendrite and the fiber axis becomes smaller.

(3) Although the metal fiber wherein a group of dendrites are arranged along the fiber axis direction is homogenous throughout the entire length, the cross section of the fiber is not composed of a single dendrite but two or more dendrites are observed.

(4) However, when the metal fiber of the above (3) is subjected to a heat treatment, no clear grain boundary is observed on the cross section and the fiber is a single crystalline material throughout the entire length, although a few dislocations, sub-boundaries and the like are observed.

In order to understand the above finding of (1) to (4) quantitatively, the present inventors have continued to study. As a result, it has been found as follows:

When the diameter of a spinning nozzle for spinning in rotating liquid is set at 100 μm or smaller (more preferably, not larger than 90 μm), a uniform dendritic texture, wherein the angle between primary arms and the fiber axis is not larger than 20° (not larger than 10°, when the diameter of a spinning nozzle is set at not larger than 90 μm), is obtained.

Although any detailed mechanism for formation of the above texture by adjusting the diameter of the fiber to not larger than 100 μm is not clear, in view of the observation results of the internal texture, crystal and orientations of the fiber obtained, it is considered as follows:

That is, a quenching rate in the cooling liquid layer is varied according to difference in the thickness of an injecting flow of a molten magnetic material and, thereby, circumstances for formation and growth of crystals are changed to arrange the growing direction of crystals toward the fiber axis direction and, further, even after dendrites have been caused to disappear by a heat treatment, the directional property of primary arms is maintained. These may affect advantageously the directional property of the crystals.

It has been found that, when the metal fiber having the above texture is subjected to a heat treatment, it turns into a single crystalline material throughout the entire length thereof. And, the heat-treated fiber has more excellent flexibility in comparison with the fiber before subjecting to heat treatment and is not broken, when it is bent at the angle of 180°. Further, in this metal fiber, crystals have a specific directional property toward the fiber axis direction, which also results in excellent magnetic properties.

For example, when the direct current (DC) magnetization property of the single crystalline metal fiber of the present invention is measured, the fiber shows a specific permeability of not less than 90,000 and a coercive force of as low as not more than 0.3 oersted under DC magnetization and has a squareness ratio of as high as not less than 0.9. Therefore, the metal fiber of the present invention has extremely excellent properties as a soft magnetic material.

As described above, the soft magnetic fiber of the present invention has a very thin diameter such as not more than 100 μm, and has a high level of specific permeability such as not less than 90,000 under DC magnetization. That is, the diameter of the fiber of the present invention is limited to not more than 100 μm because, when the diameter exceeds this value, sufficient directional properties can not be provided to the fiber texture as described in detail hereinafter and the above high level of the specific permeability can not be established. Further, the lower limit of the specific permeability under DC magnetization of 90,000 is defined because the properties required for the desired high permeability soft magnetic material can not be obtained, when the permeability is below 90,000.

Furthermore, when the diameter of the fiber exceeds 100 μm, a high level of a squareness ratio such as not less than 0.9 can not be obtained because of insufficient directional properties. The squareness ratio is limited to not less than 0.9 and the coercive force is limited to not more than 0.3 because the properties required for the desired soft magnetic material having a high squareness ratio hysteresis can not be obtained.

Figure 4:
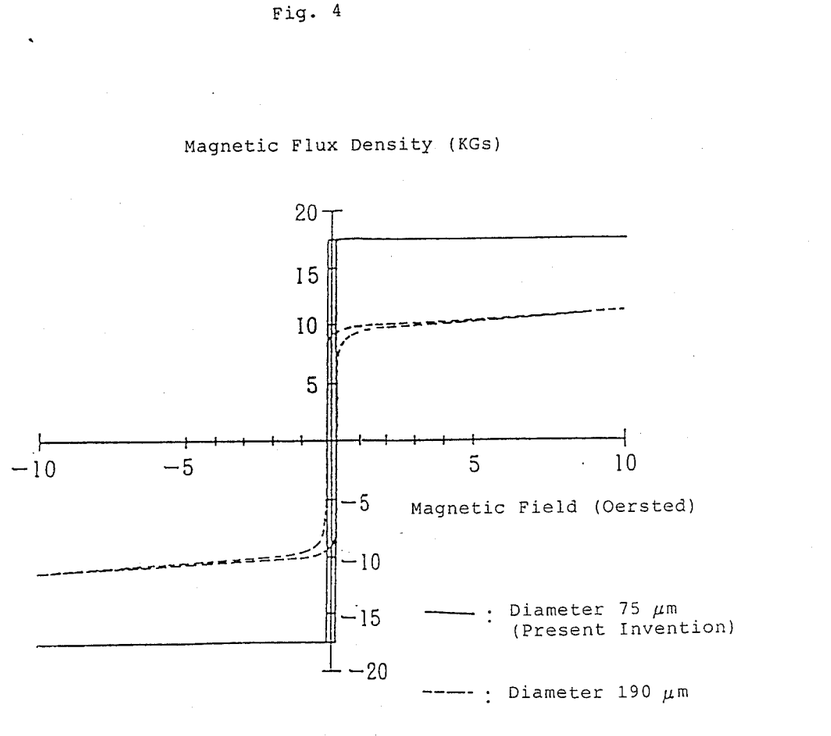
FIG. 4 is a graph illustrating direct-current magnetization curves (at room temperature) of a soft magnetic fiber.

FIG. 4 shows DC magnetization curves at room temperature obtained by applying a DC magnetic field of, at maximum, 10 oersted toward a fiber axis direction to a sample obtained by forming a magnetic fiber from a magnetic material, Fe-5.7% by weight Si alloy using injecting nozzles for spinning in rotating liquid of 190 $\mu$m and 75 $\mu$m in diameter (corresponding to those of the fibers) and then heat-treating at 1,000° C. for 1 hour. As clear from FIG. 4, each coercive force is as low as 0.3 oersted or less. However, the squareness ratio of the finer fiber of 75 $\mu$m in diameter is 0.99 which is nearly equal to 1, while that of the former is low such as 0.87.

When the diameter of the fiber exceeds 100 $\mu$m, a high level of saturation of magnetic flux density as above can not be obtained because of insufficient directional properties. The saturated magnetic flux density in a DC magnetized state is limited to not less than 18 kGauss and the magnetic flux density in the magnetic field of 10 oersted is limited to not less than 17 kGauss because properties required for the desired high magnetic flux density soft magnetic material can not be obtained.

As clear from FIG. 4, each coercive force is as low as 0.3 oersted or less. However, when the magnetic flux densities at the maximum applied magnetic field are compared with each other, the finer magnetic fiber of 75 $\mu$m in diameter shows the very high value such as 17.5 kGauss, while the thick fiber of 190 $\mu$m in diameter shows the very low value such as 11.5 kGauss. Thus, the remarkable difference in magnetic properties of these samples has been observed.

Figure 3:
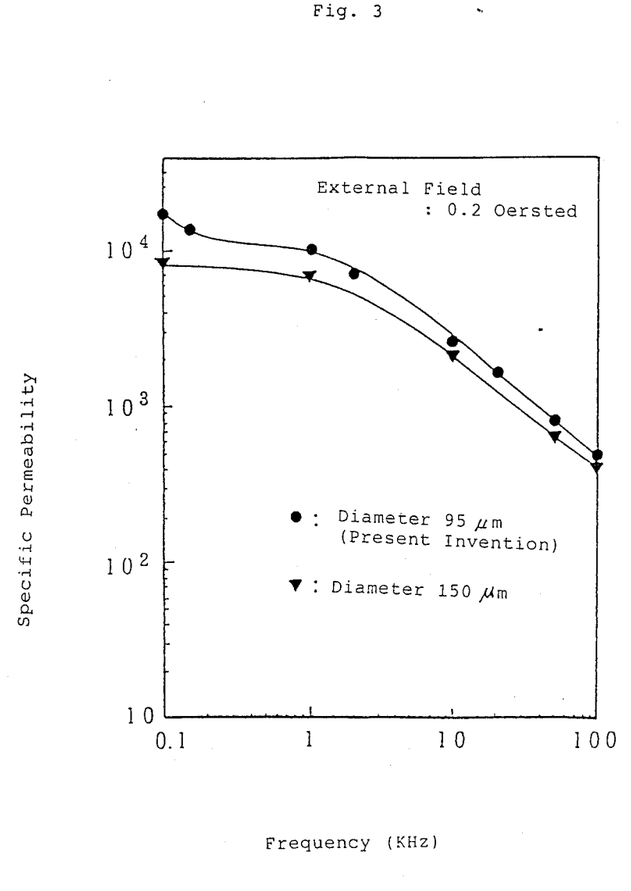
FIG. 3 is a graph illustrating a relationship between a specific permeability and an exciting frequency (at room temperature) of a soft magnetic fiber.

When DC magnetization curves at room temperature are examined according to the same manner as in FIG. 4 by using spinning nozzles of 150 $\mu$m and 95 $\mu$m in diameter, the specific maximum permeability of the resulting thick magnetic fiber of 150 $\mu$m in diameter is as low as 53,000, while that of the fine magnetic fiber of 95 $\mu$m in diameter is 121,000, which is more than two times as large as that of the former. In addition, FIG. 3 shows dependency of the specific permeability (the longitudinal axis) upon the exciting frequency (the transversal axis) regarding a sample obtained by forming a magnetic material from the same material as above according to the same spinning method as above, and then heat-treating at 1,100° C. for 2 hours. The data are obtained under the external magnetic field of 0.2 oersted. As seen from FIG. 3, the fine magnetic fiber of 95 $\mu$m in diameter shows a larger specific permeability at every frequency band when compared with the thick magnetic fiber of 150 $\mu$m in diameter.

By the way, a whisker is known as a fiber-like single crystalline material composed of a metal. The term "whisker" represents its morphology and is not defined clearly. However, a common whisker is that of several $\mu$m to several hundreds $\mu$m in diameter, several mm to several tens mm in length obtained by, for example, a vapor phase transportation method. It is a short fiber composed of more completed needle-like crystals and is clearly distinguished from a single crystalline long fiber (aspect ratio is usually more than 400) having dislocations and subboundary as in the present invention.

In the fiber of the present invention, various kinds of metals can be used. Among them, particularly, Fe-Si alloy, Fe-Al alloy and Fe-Si-Al alloy are suitable for obtaining the characteristic properties of the present invention. Further, these Fe alloys containing a suitable amount of one or more rare earth metals are also preferred. Particularly preferred rare earth metals are those selected from the lanthanum series having the atomic number of 57 to 71, more specially, La, Ce, Pr, Nd, Pm, Sm, Eu, Gd, Tb, Dy, Ho, Er, Tm, Yb and Lu. These rare earth metals can be used alone or in combination thereof. Among these rare earth metals, Ce is particularly preferable. In practicing the present invention, there can be added any other additional ingredient depending upon a particular use of the soft magnetic fiber and the required properties. Further, inevitably unremovable impurity ingredients are naturally contained in these alloy ingredients.

Figure 1:
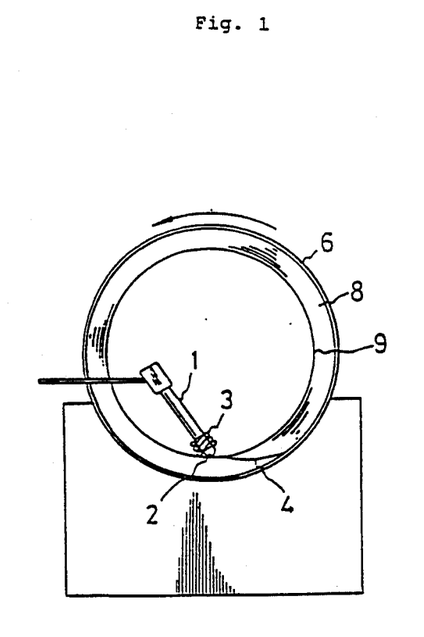
FIG. 1 is a schematic front view of one example of an apparatus used for a process by spinning in rotating liquid.
Figure 2:
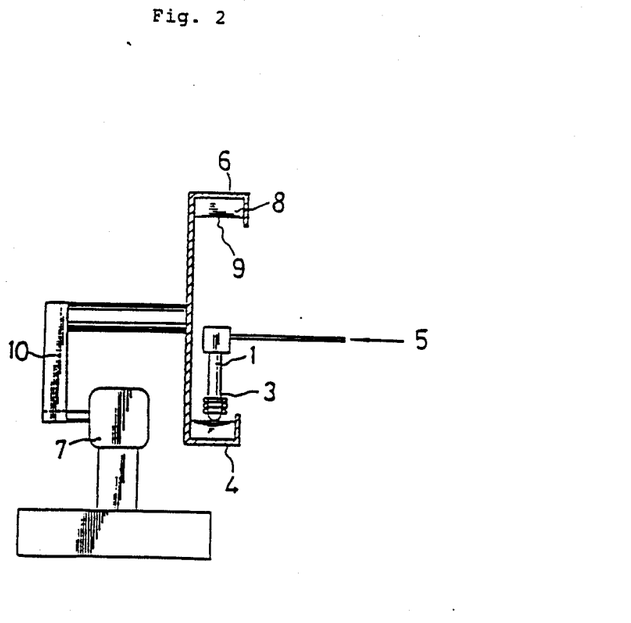
FIG. 2 is a partially cross sectioned side view of the apparatus shown in FIG. 1.

In order to produce the metal fiber of the present invention, there can be employed spinning in rotating liquid as disclosed in Japanese Patent Kokai Nos. 55-64948 and 62-56393. For example, one example of an apparatus used in spinning in rotating is shown in FIGS. 1 and 2 wherein FIG. 1 is a schematic front view of the apparatus and FIG. 2 is its partial sectioned side view. In order to carry out spinning in rotating liquid, a cooling liquid layer 8 is formed on an inner circumferential surface by rapidly rotating a rotating drum 6. Then, a molten metal is injected from a spinning nozzle 2 provided at the bottom of a crucible 1 toward the surface 9 or the interior of the cooling liquid layer 8 and the metal is converted into a fiber 4, which is wound on the inner circumferential wall of a rotating drum, while it is rapidly cooled and solidified. In the apparatus shown by FIGS. 1 and 2, the metal is molten by a heater 3 and injected by means of an inert gas 5. The drum 6 is rotated by means of a motor 7 and a belt 10. By adjusting the circumferential speed of the cooling liquid layer to substantially equal to or slightly higher than the injection speed of the molten metal from the spinning nozzle 2, the metal fiber having uniform cross sectional size and shape can be easily obtained. As a cooling liquid to be used in spinning is not limited to a specific one, any pure liquid, solution, emulsion or the like can be used. However, water is most preferred in view of cost and cooling efficiency. The rotating drum may be equipped horizontally or perpendicularly. Preferably, the surface speed of the cooling liquid layer in the rotating drum is about 300 to 800 m/min., the injection angle of the molten metal into the cooling liquid layer is 40° to 80°, and the distance between the spinning nozzle 2 and the surface of the liquid surface 9 is about 0.5 to 4 mm, respectively.

In practicing this spinning in rotating liquid according to the present invention, the bore diameter of the spinning nozzle 2 should be not larger than 100 $\mu$m, and the diameter of the spun metal fiber should be not more than 100 $\mu$m.

That is, when the bore diameter of the spinning nozzle 2 exceeds 100 $\mu$m, the diameter of the spun metal fiber also exceeds 100 $\mu$m, which results in an insufficient quenching rate. Thus, a uniform dendritic texture wherein the angle between primary arms of the dendritic texture and the fiber axis is not larger than 20° can not be obtained and the desired single crystalline structure throughout the entire length can not be obtained, even when the heat treatment as described hereinafter is effected afterward. Therefore, toughness and flexibility are unsatisfactory. On the contrary, when the nozzle of not larger than 100 μm in diameter is used, the diameter of the fiber becomes not more than 100 μm, the texture wherein the angle between primary arms of the dendritic texture and the fiber axis is uniformly not larger than 20° can be obtained and the single crystalline structure throughout the entire length can be obtained by the heat treatment afterward. Thus, excellent toughness and flexibility can be obtained.

In the present invention, the desired metal fiber can be also obtained by other melt spinning methods, if the above characteristics of the present invention are maintained. For example, the metal fiber of the present invention can be produced by spinning a molten metal from a spinning nozzle of not more than 100 μm in diameter in quenching gas such as air, nitrogen, argon, steam or the like.

The conditions of the heat treatment in the present invention should be selected according to the particular kind of metals so that dendrites formed upon quenching and solidification substantially disappear to generate homogeneous new single crystalline crystals. In general, it is suitable to carry out the heat treatment at a temperature which is lower than the solidus melting curve temperature of the metal by 10° C. but higher than ⅓ of the melting point of the metal in °C. so that the metal fiber is homogenized within a shorter period of time without melting the metal fiber.

For example, when the fiber composed of Fe-4% by weight Si is heat-treated, the treating temperature is in the range of 600° to 1,400° C., preferably, 800° to 1,300° C. In the case of the fiber composed of Fe-6.5% by weight Si, the heat treatment is carried out at 900° to 1,300° C., preferably, 950° to 1,250° C.

Further, the heat treatment is desirably carried out under vacuum or in an atmosphere of an inert gas such as argon or the like, or in a reducing atmosphere of argon containing about 10% of hydrogen.

When the heat treatment is carried out under vacuum, the degree of vacuum is not greater than 0.01 Torr, preferably, not greater than 0.001 Torr.

In order to clarify the reason why the magnetic flux density is considerably improved by decreasing the diameter of the magnetic fiber, the internal texture has been examined and the following points have been confirmed. That is, in the case of a thick magnetic fiber larger than 100 μm in diameter, the growing direction of many of the primary arms of dendrites is at an angle larger than 20° relative to the fiber axis before the heat treatment, while in the case of a fine magnetic fiber of less than 100 μm in diameter, the growing direction of all of the primary arms of dendrites is at an angle not larger than 20° relative to the fiber axis. When these are heat-treated to decrease grain boundaries and internal strain and orientation of crystals are examined by an etch pitting method, it is confirmed that the crystal orientation of the heat-treated fiber reflects the texture before the heat treatment. That is, in the case of a thick magnetic fiber, many of specific crystal orientations are at an angle larger than 20° relative to the fiber axis direction, while in the case of a fine magnetic fiber, specific crystal orientations are uniformly at an angle not larger than 20° relative to the fiber axis direction. It has been known that an easily magnetizable direction has a certain relationship with a crystal orientation. In the case of a fine magnetic fiber not larger than 100 μm in diameter, the primary arms of the dendrites which are arranged uniformly at an angle not larger than 20° relative to the fiber axis before the heat treatment are effectively reflected in the structure, even after grain boundaries and internal strain are decreased. As the result, the easily magnetizable and extremely anisotropic magnetic fiber is obtained. It is considered that these points advantageously effect an increase in the magnetic flux density.

In addition, very few grain boundary means excellence toughness and flexibility. Therefore, the magnetic fiber is a material having good handling properties including fabrication thereof.

In general, the metal fiber thus obtained has a round cross section such as a circle, ellipse, etc. However, the cross sectional shape is not limited thereto and can be changed, for example, by choosing a spinning nozzle having a suitable cross sectional shape.

The soft magnetic fiber having a high permeability thus obtained can be used as a miniaturized soft magnetic material in the form of one individual fiber. Further, it can be used as a soft magnetic material having excellent high frequency properties in the form of a bundle of fibers by coating with an insulating material according to a suitable method.

For example, an effective magnetic amplifier having a very small time constant can be made by applying the soft magnetic material to the magnetic core of the magnetic amplifier.

The following Examples further illustrate the present invention in detail but is not to be construed to limit the scope thereof.

EXAMPLE 1

Spinning in rotating liquid was carried out by using the apparatus as shown in FIGS. 1 and 2 by and Fe-6.5% by weight Si alloy as a starting metal with varying the diameter of the injecting nozzle to produce iron alloy metal fibers having different diameters. As the cooling liquid, water was used (15° C.). Although spinning conditions vary depending upon the diameter of the spinning (injecting) nozzle, basically, the rotating speed of the drum and the injecting speed of the molten metal were controlled so that the surface speed of the water layer in the rotating drum was equal to or slightly larger than the jet flow speed of the molten metal to obtain 3 kinds of the metal fibers of 150 μm, 90 μm and 70 μm in diameter, which were heat-treated under vacuum atmosphere (not greater than $5 \times 10^{-4}$ Torr) at 1,100° C. for 2 hours using an electric furnace.

Among these 3 metal fibers, the fiber of 150 μm in diameter had poor flexibility throughout the entire length because the angle between primary arms and the fiber axis was large and had a polycrystal structure even after the heat treatment, although a dendritic texture was observed before the heat treatment. On the contrary, in the metal fiber of π1 μm in diameter, the primary arms of the dendritic texture grew uniformly at an angle of about 7° relative to the fiber axis and no definite grain boundaries were observed in the texture after heat treatment, although sub-boundaries were observed. Therefore, the fiber was flexible throughout the entire length and could be bent at the angle of 180°. In addition, the fiber of 70 μm in diameter could be bent at an angle of about 180° throughout the entire length because the angle between the primary arms of the dendritic texture and the fiber axis was uniformly within about 4°.

Then, the metal fiber of 70 μm in diameter was wetabraded toward both fiber axis and its crosswise directions and about 10 to 20 μm of crystallographic micropits, which were suitably distributed on the surface of the sample, were prepared by etch pitting method. The shapes and orientations relative to the fiber axis direction of the pits were observed and it was found that the shapes of the etched pits on the section at the right angle to the fiber axis direction were almost identical to each other and the orientations were also identical.

Although the shapes and orientations of etched pits on the section along the fiber axis direction were almost identical to each other, the orientations inclined continuously relative to the fiber axis in some cases. It was found that this metal fiber was a substantially single crystalline material, although subboundaries were present in the interior. The metal fiber of 70 μm in diameter had excellent soft magnetic properties such as the saturation magnetic flux density of 1.8 tesla, the coercive force of 0.14 oersted, the specific permeability of 121,000 and the DC magnetization squareness ratio of 0.98.

EXAMPLE 2

According to the same manner as described in Example 1, two kinds of iron metal fibers having different diameter (160 μm and 70 μm) were obtained by spinning molten Fe-25% by weight Al and homogenization was effected by heat treatment under vacuum atmosphere (not greater than $3 \times 10^{-4}$ at 1,150° C. for 2 hours. In the metal fiber of 160 μm in diameter, a clear grain boundary was observed, while the metal fiber of 70 μm in diameter was a substantially single crystalline material because no clear grain boundary was observed in spite of presence of partial sub-boundaries.

EXAMPLE 3

According to the same manner as described in Example 1, iron metal fibers of 200 μm, 155 μm and 65 μm in diameter, respectively, preparation by using Fe-5.2% by weight Al-2.7% by weight Si alloy and then homogenization was effected by heat treatment under vacuum atmosphere ($2 \times 10^{-4}$ Torr) at 1,100° C. for 10 hours.

As the result, grain boundaries were observed in both fibers of 220 μm and 155 μm in diameter, but the metal fiber of 65 μm in diameter was a single crystalline material because no clear grain boundary was observed in spite of presence of sub-boundaries.

As described hereinabove, according to the present invention, brittleness of a metal fiber can be improved with maintaining its original properties. Therefore, the metal fiber of the present invention is very flexible and easy to bend and, thereby, handling properties can be remarkably improved. In addition, the fiber is a single crystalline material and has excellent magnetic properties. Such a single crystalline metal fiber of the present invention can be used as a fiber material which meets requirements in both properties of high permeability and low coercive force as well as requirements in soft magnetic property. Further, since the metal fiber of the present invention is a soft magnetic fiber, it can be utilized as a very miniaturized soft magnetic material such as a core material of various electromagnetic apparatuses and other various electromagnetic fields, for example, a sensor and the like.

What is claimed is:

1. A soft magnetic metal fiber having a unidirectional dendritic texture which is an assembly texture of a group of dendrites wherein primary arms have grown at an angle of, at largest, 20° relative to the metal fiber axis, a diameter of said metal fiber being not larger than 100 μm.

2. A soft magnetic metal fiber according to claim 1, wherein the metal is selected from the group consisting of Fe-Si alloy, Fe-Al- alloy and Fe-Si-Al alloy.

3. A soft magnetic metal fiber according to claim 1, wherein the fiber has a round section.

4. A soft magnetic metal fiber according to claim 1, wherein the metal is selected from the group consisting of Fe-Si-rare earth metal alloy, Fe-Al-rare earth metal alloy and Fe-Si-Al-rare earth metal alloy.

5. A soft magnetic metal fiber according to claim 4, wherein the rare earth metal is one or more metal selected from the group consisting of lanthanum series having the atomic number of 57 to 71.

6. A soft magnetic metal fiber according to claim 4, wherein the rare earth metal is Ce.

7. A single crystalline soft magnetic metal fiber having defects which include dislocations and sub-boundaries and wherein said sub-boundaries are where the orientations of the crystals differ from each other in a angle range of not larger than a few degrees, and which is a single crystalline material throughout the entire length thereof, diameter of said fiber being not larger than 100 μm, length of said fiber being not less than 40 mm.

8. A soft magnetic metal fiber according to claim 7, wherein the metal is selected from the group consisting of Fe-Si alloy, Fe-Al alloy and Fe-Si-Al alloy.

9. A soft magnetic metal fiber according to claim 7, wherein the fiber has a round section.

10. A soft magnetic metal fiber according to claim 7, wherein the metal is selected from the group consisting of Fe-Si-rare earth metal alloy, Fe-Al-rare earth metal alloy and Fe-Si-Al-rare earth metal alloy.

11. A soft magnetic metal fiber according to claim 10, wherein the rare earth metal is one or more metals selected from lanthanum series having 57 to 71 of atomic number.

12. A soft magnetic metal fiber according to claim 10, wherein the rare earth metal is Ce.

13. A single crystalline soft magnetic metal fiber according to claim 7, wherein the specific permeability under direct current magnetization is not less than 90,000.

14. A single crystalline soft magnetic metal fiber according to claim 7, wherein the squareness ratio (Br/Bs) is not less than 0.9 and the coercive force is not larger than 0.3 oersted under direct current magnetization, in which Br is a remaining magnetic flux density and Bs is saturated magnetic flux density.

15. A single crystalline soft magnetic metal fiber according to claim 7, wherein the saturation magnetic flux density under direct current magnetization is not less than 18 kGauss and the magnetic flux density under 10 oersted of magnetic field is not less than 17 kGauss.

16. A process for producing a soft magnetic metal fiber having unidirectional dendritic texture which comprises melt-spinning a molten metal from a spinning nozzle of not larger than 100 μm in diameter and quenching the resulting wire material to solidify to obtain the metal fiber having an assembly texture of a group of dendrites wherein primary arms have grown at an angle of, at largest, 20° relative to the metal fiber axis.

17. A process according to claim 16, wherein the metal is selected from the group consisting of Fe-Si alloy, Fe-Al alloy and Fe-Si-Al alloy.

18. A process according to claim 16, wherein the metal is selected from the group consisting of Fe-Si-rare earth metal, Fe-Al-rare earth metal and Fe-Si-Al-rare earth metal.

19. A process according to claim 18, wherein the rare earth metal is one or more metal selected from lanthanum series having the atomic number of 57 to 71.

20. A process according to claim 18, wherein the rare earth metal is Ce.

21. A process according to claim 16, wherein the melt spinning is carried out by injecting the molten metal into a cooling liquid layer formed along an inner circumferential surface of a rotating cylindrical drum through the spinning nozzle.

22. A process according to claim 16, wherein the melt spinning is carried out by spinning the molten metal in quenching gas.

23. A process for producing a single crystalline soft magnetic metal fiber having defects which include dislocations and sub-boundaries and wherein said sub-boundaries are where the orientations of the crystals differ from each other in a angle range of not larger than a few degrees, and which process comprises melt-spinning a molten metal from a spinning nozzle of not larger than 100 μm in diameter, quenching the resulting wire material to solidify, heat-treating the resulting wire to homogenize to obtain a metal fiber which is a single crystalline material throughout the entire length and is not less than 100 μm in diameter and not less than 40 mm in length.

24. A process according to claim 23, wherein the metal is selected from the group consisting of Fe-Si alloy, Fe-Al alloy and Fe-Si-Al alloy.

25. A process according to claim 23, wherein the metal is selected from the group consisting of Fe-Si-rare earth metal alloy, Fe-Al-rare earth metal alloy and Fe-Si-Al-rare earth metal alloy.

26. A process according to claim 25, wherein the rare earth metal is one or more metals selected from lanthanum series having the atomic number of 57 to 71.

27. A process according to claim 25, wherein the rare earth metal is Ce.

28. A process according to claim 23, wherein the heat treatment temperature is lower than a temperature a solidus melting curve of the metal by 10° C. but not lower than ⅓ of the melting point of the alloy in °C.

29. A process according to claim 23, wherein the melt-spinning is carried out by injecting a molten metal into a cooling liquid layer formed along an inner circumferential surface of a rotating cylindrical drum through the spinning nozzle.

30. A process according to claim 23, wherein the melt-spinning is carried out by spinning the molten metal in quenching gas.

* * * * *